United States Patent [19]

Bijker et al.

[11] Patent Number: 5,404,589
[45] Date of Patent: Apr. 4, 1995

[54] FM RECEIVER WITH DYNAMIC INTERMEDIATE FREQUENCY (IF) FILTER TUNING

[75] Inventors: Wolter Bijker; Wolfdietrich G. Kasperkovitz; Hendricus C. De Ruyter; Willem A. Sloof, all of Eindhoven, Netherlands

[73] Assignee: U.S. Philips Corporation, New York, N.Y.

[21] Appl. No.: 79,714

[22] Filed: Jun. 18, 1993

[30] Foreign Application Priority Data

Jun. 26, 1992 [EP] European Pat. Off. ............ 92201906

[51] Int. Cl.⁶ .............................................. H04B 1/16
[52] U.S. Cl. .................................. 455/200.1; 455/266; 455/304; 455/308; 455/340
[58] Field of Search .................. 455/63, 200.1, 245.1, 455/266, 295, 296, 304–309, 337, 340, 209, 210, 254, 192.1–192.3, 195.1, 211, 239.1, 240.1, 241.1, 245.2

[56] References Cited

U.S. PATENT DOCUMENTS

| | | | |
|---|---|---|---|
| 5,155,862 | 10/1992 | Hansen | 455/266 |
| 5,263,187 | 11/1993 | Sugawa et al. | 455/266 X |
| 5,283,557 | 2/1994 | Hansen | 455/307 X |

FOREIGN PATENT DOCUMENTS 54-140442 10/1979 Japan .................... 455/266
9013175 11/1990 WIPO .

Primary Examiner—Edward F. Urban
Assistant Examiner—Chi H. Pham
Attorney, Agent, or Firm—Bernard Franzblau

[57] ABSTRACT

An FM receiver with a modulation signal-dependent intermediate frequency (IF) filter tuning, comprising a radio frequency (RF) section, a tunable mixer stage for a down-conversion of a desired RF FM reception signal to an intermediate frequency (IF) FM signal, an IF section comprising a tunable IF filter, and an FM demodulator for demodulating the baseband modulation signal of the IF FM signal. The demodulator is coupled to a baseband signal processing device and an IF tuning control loop couples the FM demodulator to a tuning control input of the IF filter for an instantaneous tuning control of the IF filter by means of the baseband modulation signal. In order to enhance the tuning behaviour, the FM receiver includes a first amplifier-limiter connected in the IF tuning control loop between an output of the FM demodulator and the tuning control input of the IF filter. The gain of said first amplifier-limiter gradually decreases as the input signal increases. The first amplifier-limiter supplies an output signal whose amplitude increases monotonically to a limiting value for a continuous and gradual limitation of the tuning control signal in the IF tuning control loop at an increasing output signal amplitude of the FM demodulator.

15 Claims, 2 Drawing Sheets

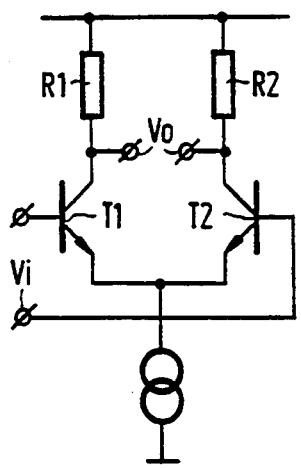
FIG. 2
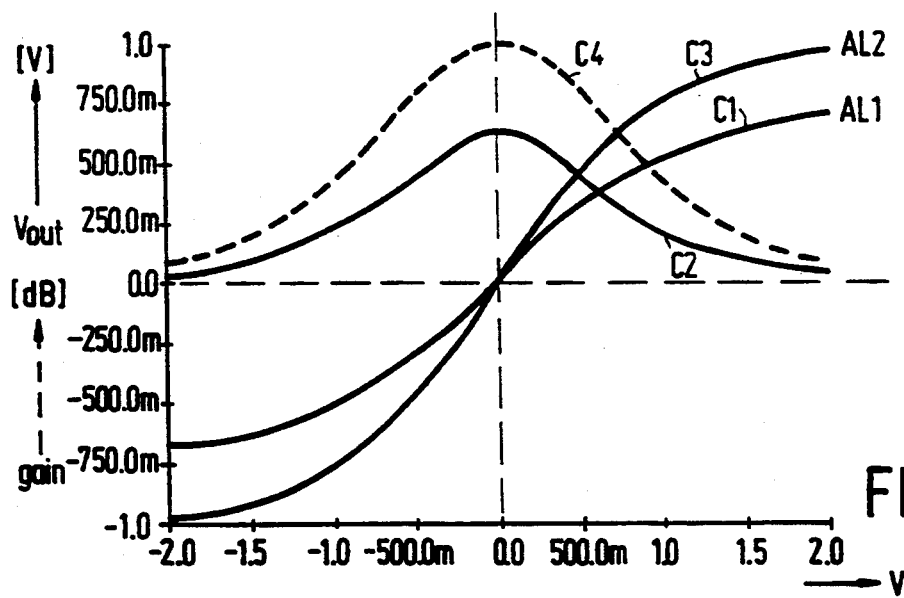
FIG. 3
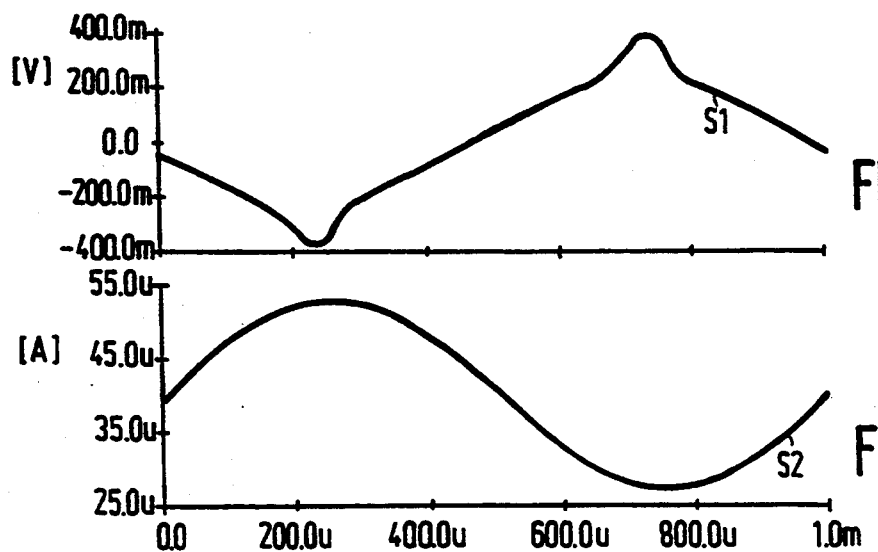
FIG. 4A
FIG. 4B

FM RECEIVER WITH DYNAMIC INTERMEDIATE FREQUENCY (IF) FILTER TUNING

BACKGROUND OF THE INVENTION

This invention relates to an FM receiver comprising a radio frequency (RF) section, means for a down-conversion of a desired RF FM reception signal to an intermediate frequency (IF) FM signal, an IF section comprising a tunable IF filter, an FM demodulator for demodulating the baseband modulation signal of the IF FM signal, which demodulator is coupled to a baseband signal processing device, and an IF tuning control loop via which the FM demodulator is coupled to a tuning control input of the IF filter for an instantaneous tuning control of the IF filter by means of the baseband modulation signal.

An FM receiver of this type is known from the international PCT Application WO 88/08223, which corresponds to U.S. Pat. No. 5,155,862.

The meters for a down-conversion of a desired RF FM reception signal to an intermediate frequency (IF) FM signal of the known FM receiver comprise a tunable first mixer stage with which a desired RF FM reception signal from an RF FM reception range is converted down to a first intermediate frequency of 10.7 MHz. After a first IF selection in tiffs known FM receiver, the first intermediate frequency (IF) signal thus obtained is subsequently converted down again by means of a fixed second mixer stage, which results in a second IF signal having an average intermediate frequency of 700 kHz. After a second IF selection in said tunable IF filter, this second IF signal is applied to the FM demodulator for demodulating the second IF signal, which results in the desired baseband modulation signal. An output of the FM demodulator is coupled to the tuning control input of the tunable IF filter for a dynamic control of the tuning of the IF filter dependent upon the baseband modulation signal. Consequently, the resonance frequency of the IF filter instantaneously tracks the frequency modulation of the IF FM signal, so that the IF filter can have a comparatively narrow band, which enhances the selectivity.

In order to prevent that a neighbouring transmitter carrier, whose frequency approaches the carrier of the desired signal and which comes within the capturing range of the IF tuning control loop, gives rise to a tuning of the IF filter at this neighbouring transmitter, the tuning control of the known FM receiver is switched off at a given amplitude level of the tuning control signal, which is directly followed by a reset of the tuning of the IF filter at an initial value, for example, at the 700 kHz intermediate frequency. Switching off the tuning control of the IF filter and recapturing the IF tuning control at the desired carrier when it reappears in the passband of the IF filter tuned by means of said initial reset, gives rise to clearly audible noise peaks which may subsist through comparatively long periods and/or may lead to comparatively long muting periods if these noise signals are suppressed by means of a muting circuit.

SUMMARY OF THE INVENTION

It is, inter alia, an object of the invention to obviate these drawbacks in a simple manner.

According to the invention, an FM receiver of the type described in the opening paragraph is characterized in that a first amplifier-limiter is arranged in the IF tuning control loop between an output of the FM demodulator and the tuning control input of the IF filter, the gain of said first amplifier-limiter gradually decreasing at an increasing input signal amplitude so as to supply an output signal whose amplitude increases monotonically to a limiting value for a continuous and gradual limitation of the tuning control sign,d in the IF tuning control loop at an increasing output signal amplitude of the FM demodulator.

The invention is based on the recognition that the capture-and-hold behaviour of the IF tuning control loop is greatly enhanced by uninterruptedly maintaining the tuning control and by limiting the amplitude of the tuning control signal.

When the measure according to the invention is used, tuning to an unwanted neighbouring transmitter is prevented, i.e. after the IF tuning control loop has captured a strong neighbouring transmitter, the tuning of the IF filter tracks the average carrier frequency of this neighbouring transmitter. The amplitude limitation of the tuning control signal also results in the IF filter remaining tuned during the period of limitation at a frequency which renders rapid capturing by the IF tuning control loop of the desired transmitter carrier possible without extra measures being required for an initial reset of the tuning of the IF filter.

Such an FM receiver according to the invention is preferably characterized in that the FM demodulator comprises a multiplier circuit and means for deriving, from the IF FM signal, a pair of FM-modulated signals having a mutually equal modulation signal and a phase difference which is 90 degrees on average at the carrier frequency and which varies with the FM modulation signal, said means comprising a tunable frequency-dependent phase-shifting circuit having a tuning control input, said FM demodulator also comprising a demodulator tuning control loop including a low-pass filter via which an output of the multiplier circuit is coupled to the tuning control input of the frequency-dependent phase-shifting circuit, the gain in the IF tuning control loop being smaller than that in the demodulator tuning control loop.

When this measure is used, an accurate matching of the loop parameters of the IF tuning control loop with those of the demodulator tuning control loop is possible in a simple manner. The capture-and-hold behaviour of the demodulator tuning control loop can be set in a correct manner with respect to that of the IF tuning control loop so as to prevent neighbouring transmitters from disturbing the control action of the IF tuning control. Such an FM quadrature demodulator is known per se, for example, from German Patent Application no. 26 36 268.

A further preferred embodiment of the FM receiver according to the invention is characterized in that the demodulator tuning control loop of the FM demodulator incorporates a second amplifier-limiter, an output of which is coupled to the tuning control input of the tunable frequency-dependent phase-shifting circuit and to the baseband signal processing device, the gain of said second amplifier-limiter gradually decreasing for an increasing input signal amplitude so as to supply an output signal whose amplitude increases monotonically to a limiting value for a continuous and gradual limitation of the tuning control signal in the demodulator tuning control loop at an increasing output signal amplitude of the FM demodulator, the tuning frequency deviation in the frequency-dependent phase-shifting circuit occurring at the limiting value of the second amplifier-limiter being larger than the tuning frequency deviation in the IF filter occurring at the limiting value of the first amplifier-limiter.

When this measure is used, a low-distortion demodulation of the baseband modulation signal is obtained, and, without interrupting the loop action, unwanted tuning variations are simply prevented from occurring. A considerable reduction of interference is then obtained.

An embodiment of such an FM receiver which can be realised at relatively low cost is characterized by a loop filter which is common to said two tuning control loops and is arranged between an output of the multiplier circuit of the FM demodulator and inputs of the first and second amplifier-limiters.

A further simplification is obtained by realising each of the two amplifier-limiters by means of an emitter-coupled transistor pair.

Another preferred embodiment of an FM receiver according to the invention, which can be very easily integrated, is characterized in that the IF filter and the frequency-dependent phase-shifting circuit comprise first and second cascade-arranged resonance amplifiers, respectively, each having in-phase and quadrature inputs and outputs, said in-phase and quadrature inputs of the first resonance amplifier receiving in-phase and quadrature components of the IF signal, said in-phase and quadrature outputs of the first resonance amplifier being coupled to first inputs of first and second multiplier stages of the multiplier circuit, and in-phase and quadrature outputs of the second resonance amplifier being coupled to second inputs of the second and first multiplier stages, respectively, outputs of the two multiplier stages being coupled to inputs of a superposition circuit for a mutual superposition of the output signals of the first and second multiplier stages, said superposition circuit being coupled to a low-pass filter which is arranged in common in said two tuning control loops.

Resonance amplifiers of this type are known per se from European Patent Application EP 0 420 974, which corresponds to WO 90/ 131 7S.

BRIEF DESCRIPTION OF THE DRAWINGS

These and other aspects of the invention will be apparent from and will be further elucidated with reference to the embodiments described hereinafter in connection with the accompanying drawing. Elements having corresponding functions are denoted by the same reference indications. In the drawings:

FIG. 2 shows an amplifier-limiter for use in the receiver of FIG. 1;

FIG. 3 shows the variation of the gain of amplifier-limiters for use in the FM receiver of FIG. 1 as a function of the input signal amplitude; and FIG. 4A and 4B show some signal waveforms to illustrate the low-distortion signal processing in the FM receiver of FIG. 1.

DESCRIPTION OF THE PREFERRED EMBODIMENTS

Figure 1:
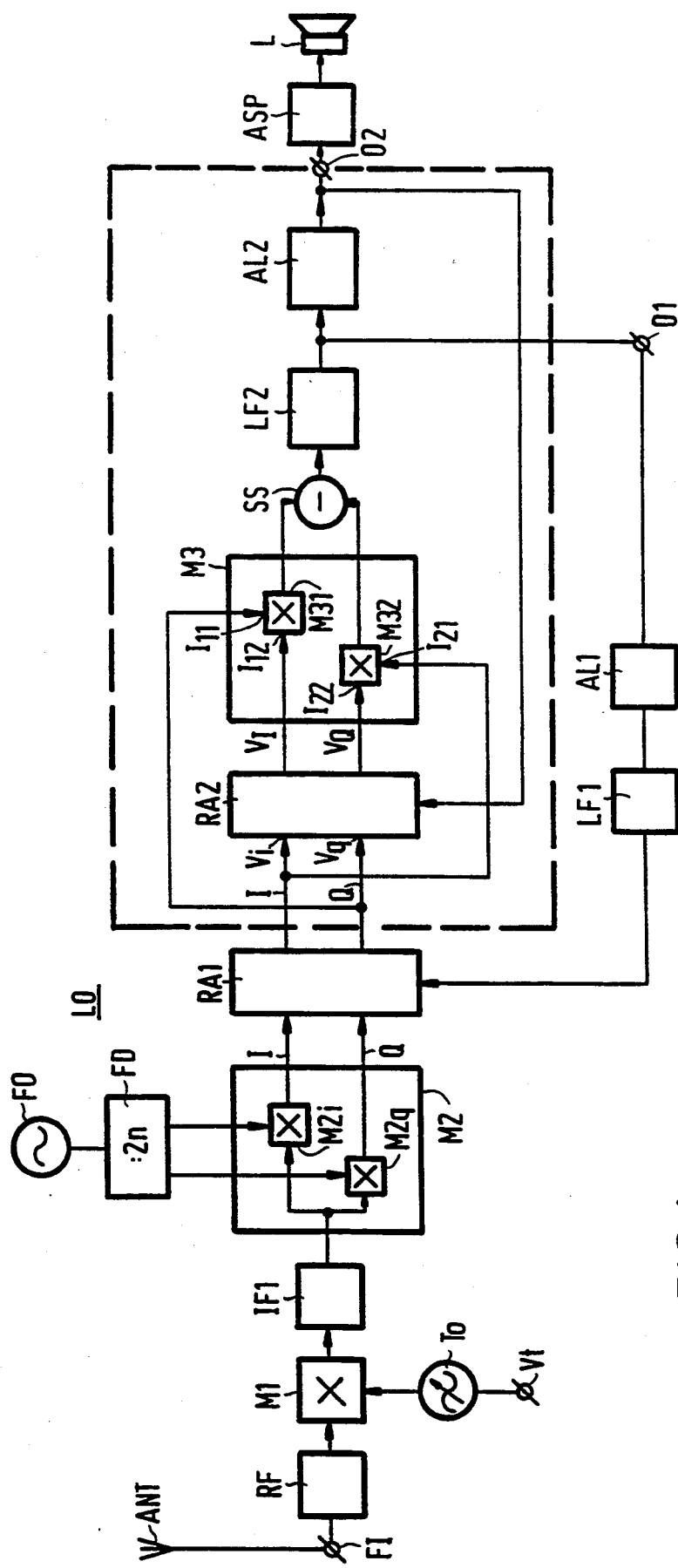
FIG. 1 shows an FM receiver according to the invention.

FIG. 1 shows an FM receiver according to the invention having a radio frequency CRF) antenna input for connecting an antenna ANT thereto, to which is coupled an RF input section RF for an RF amplification and selection of a desired RF FM reception signal, followed by means for a down-conversion of a desired RF FM reception signal to an intermediate frequency, and comprising a tunable first mixer stage M1 to which a tunable oscillator signal is applied from a tuning oscillator TO for tuning, and frequency conversion of the desired RF FM reception signal to a first intermediate frequency (IF) signal having a carrier frequency located on average at a first intermediate frequency f1, and comprising a first IF section IF1 for selecting the first IF signal, followed by a second mixer stage M2 for a down-conversion of the first IF signal to a second IF signal having a carrier frequency located on average at a second intermediate frequency f2.

The tuning oscillator TO is tuned at a frequency which deviates by the value of f1 from that of the carder frequency of the desired RF FM reception signal by means of a tuning voltage applied via a tuning control terminal Vt, while a mixing signal having a fixed oscillator frequency deviating by the value of f2 from the first intermediate frequency f1 is applied to the second mixer stage M2 from a fixed local oscillator device FO.

The down-conversion in the second mixer stage M2 is accompanied by a conversion from single phase to phase quadrature. To this end the second mixer stage M2 comprises an in-phase multiplier circuit M2i and a quadrature multiplier circuit M2q to which the first IF signal on the one hand and in-phase and quadrature mixing signal components on the other hand are applied in common from a fixed local oscillator device FO. These in-phase and quadrature mixing signal components are obtained by dividing the frequency of the oscillator signal of oscillator FO by a correct even factor in a frequency divider FD. In a practical embodiment the first intermediate frequency was 10.7 MHz, the second intermediate frequency was 300 kHz, the oscillator frequency of the oscillator FO was 22 MHz and the division factor of the FD was 2.

The second mixer stage M2 has in-phase and quadrature outputs which are coupled via in-phase and quadrature signal paths I and Q to a first tunable resonance amplifier RA1 operating as a tunable IF filter for selecting the second IF signal. Such a resonance amplifier is known per se from European Patent Application EP 0 420 974 and is particularly suitable to be integrated. It is known from the last-mentioned Patent Application that such resonance amplifiers in their relevant use as a tunable polyphase filter of the phase-quadrature type have a linear tuning behaviour also at very large values of the resonance frequency fres and have a bandpass characteristic which is symmetrical around fres and a point-symmetrical phase characteristic so that a low-distortion selection is obtained.

The first resonance amplifier RA1 is coupled to a phase-quadrature FM demodulator DEM, prexling a baseband modulation signal processing device ASP for processing the baseband audio modulation signal and a sound reproducing device L for reproducing the desired audio signal.

A first output 01 of the FM demodulator DEM is coupled via a first amplifier-limiter AL1 and a low-pass filter operating as a first loop filter LF1 to a tuning control input of the first tunable resonance amplifier RA1. The first amplifier-limiter AL1 is to be used for the amplification and gradual limitation (soft limiting) of the IF filter tuning control signal and the first loop filter LF1 for a selection thereof, which will be described hereinafter. An IF tuning control loop is thereby obtained which varies the tuning frequency of the first resonance amplifier RA1 operating as the second IF filter instantaneously with the baseband modulation signal of the second IF signal. The bandwidth of the first tunable resonance amplifier RA1 can thus be chosen to be considerably smaller than the bandwidth of the baseband modulation signal so that a comparatively high IF selectivity is feasible without any loss of useful signal information.

The gain of the amplifier-limiter AL1 gradually decreases for an increasing input voltage, such that the output voltage increases at an increasing value of the input voltage, for example, in accordance with a tangent hyperbola function and, due to saturation phenomena at an input voltage increasing towards infinity, asymptotically approaches a given limiting value. The choice of the limiting value will be described hereinafter. An amplifier-limiter including a transistor difference pair is shown in FIG. 2 and comprises an emitter-coupled transistor pair T1, T2 with a common emitter current source and collector resistors R1 and R2. In the embodiment shown without emitter resistors said tangent hyperbola function is obtained. By using emitter resistors there may be a deviation from this function while maintaining the character of a gradual limitation. The first amplifier-limiter AL1 shown supplies an output voltage and a gain which vary as a function of the input voltage as is shown by means of curves C1 and C2, respectively, in FIG. 3. For the sake of completeness, FIG. 3 shows corresponding characteristics by means of curves C3 and C4 of a second amplifier-limiter AL2 to be further described. The circuit configuration of such amplifier-limiters as well as their behaviour at a varying input voltage is known to those skilled in the art and does not need any further description for an understanding of the invention.

As a result of the limitation of the output signal of the first amplifier-limiter AL1 in the case of a demodulator output signal increasing in amplitude at the first output O1, and when the IF tuning control loop captures an unwanted neighbouring transmitter carrier, the IF filter RA1 will only track the frequency modulation of this neighbouring transmitter carrier in so far and as long as this frequency modulation takes place within the control range of this IF tuning control loop. If the neighbouring transmitter carrier exceeds this control range, the tuning control is maintained and the IF filter RA1 will be held at the tuning frequency determined by the limiting level of the IF tuning control signal. When the desired carrier reappears within the tuning control range of the IF tuning control loop in the last-mentioned position of the IF filter RA1, RA1 will track this desired carder in tuning frequency again. Since the gain of the first amplifier-limiter AL1 gradually decreases with a demodulator output signal increasing in amplitude at the first output O1, an effective reduction of interference due to capturing phenomena is obtained.

The FM demodulator DEM comprises a second resonance amplifier RA2 operating as a tunable frequency-dependent phase-shifting circuit and having in-phase and quadrature inputs Vi and Vq which are coupled to said in-phase and quadrature signal paths I and Q, respectively, and in-phase and quadrature outputs VI and VQ, a multiplier circuit M3 operating as a phase-quadrature third mixer stage having first and second multiplier stages M31 and M32 operating as first and second phase comparison circuits having first and second inputs I11 and I12, I21 and I22, respectively, a superposition circuit SS having successively coupled thereto a low-pass filter operating as a second loop filter LF2 and the afore-mentioned second amplifier-limiter AL2. An output of the second loop filter LF2 is connected to the first output O1, while an output of the second amplifier-limiter AL2 is connected to a second output O2 of the FM demodulator DEM.

In the embodiment shown the quadrature input signal path Q of the second tunable resonance amplifier RA2 operating as a frequency-dependent phase-shifting circuit is coupled to the first input I11 of the first multiplier stage M31 and to the quadrature input Vq of the resonance amplifier RA2. The in-phase input signal path I of the second tunable resonance amplifier RA2 is coupled to the first input I21 of the second multiplier stage M32 and to the in-phase input Vi of the resonance amplifier RA2. The in-phase output VI of the second tunable resonance amplifier RA2 is coupled to the second input I12 of the first multiplier stage M31, while the quadrature output VQ of the resonance amplifier RA2 is coupled to the second input I22 of the second multiplier stage M32. Outputs of the first and second multiplier stages M31 and M32 are coupled to inputs of the superposition circuit SS in which a suitable superposition is formed from the output signals of the first and second multiplier stages M31 and M32, which will hereinafter be described in greater detail.

The second tunable resonance amplifier RA2 realises a frequencydependent phase shift of the in-phase input signal applied to the in-phase input Vi and of the quadrature signal applied to the quadrature input Vq, which phase shift varies with the modulation signal and is zero at the second intermediate frequency f2. Consequently, a pair of FM-modulated signals having a mutually equal modulation signal and a phase difference which is 90° on average at the carrier frequency and varies with the FM modulation signal is applied to each of the first and second multiplier stages M31 and M32 operating as first and second phase comparison circuits of the multiplier circuit M3. The desired baseband modulation signals which may occur, for example, in a mutually opposite phase are obtained in the DC components at the outputs of the first and second multiplier stages M31 and M32 of the multiplier circuit M3. Moreover, second-order interference products are obtained which occur with a mutually equal phase in the given example. By suitable superposition in the superposition circuit SS—forming a difference in this example—a compensation of said second-order interference components is obtained, while the desired DC components in the output signals of the first multiplier stage M31 and the second multiplier stage M32 are mutually added to each other. The baseband modulation signal is selected by means of the second loop filter LF2, which second loop filter LF2 precedes the second amplifier-limiter AL2. The gain characteristic of the second amplifier-limiter AL2 corresponds to that of the first amplifier-limiter AL1, on the understanding that also the gain of the amplifier-limiter AL2 gradually decreases for an increasing input voltage, such that the output voltage monotonically increases at an increasing value of the input voltage, for example, in accordance with a tangent hyperbola function and asymptotically approaches a given limiting value due to saturation phenomena at an input voltage increasing towards infinity. The gain characteristic and function of the second amplifier limiter AL2 correspond to those of the first amplifier-limiter AL1 but it has a gain and limiting level which are preferably larger than those of the first amplifier-limiter AL1, as is shown by means of curves C3 and C1 in FIG. 3.

The output of the second amplifier-limiter AL2 is coupled to a tuning control input of the second tunable resonance amplifier RA2 for controlling the tuning of the second tunable resonance amplifier RA2 dependent upon the baseband modulation signal and is coupled to said baseband modulation signal processing device ASP. A demodulator tuning control loop with which a tuning, varying the baseband modulation signal, of the second tunable resonance amplifier RA2 operating as a frequency-dependent phase-shifting circuit is obtained is realised via the superposition circuit SS, the second loop filter LF2, the second amplifier-limiter AL2 and the feedback to the tuning control input of the second tunable resonance amplifier RA2. Consequently, the trajectory through which the second IF signal traverses the phase characteristic of the second tunable resonance amplifier RA2 is greatly reduced, resulting in a linearization of the demodulation action of the FM demodulator DEM.

In the embodiment shown the IF tuning control loop and the demodulator tuning control loop have a number of circuits in common, inter alia the second loop filter LF2.

In order to avoid signal distortion in the demodulator tuning control loop as a result of the non-linear gain characteristic of the amplifier-limiter AL2, the gain in this loop is chosen to be comparatively high. Starting from a sinusoidal baseband modulation signal, any deviation from this sine shape is negatively fed back to a strong extent and thereby reduced. The sinusoidal baseband modulation signal as is shown by means of curve S2 in FIG. 4B is then obtained substantially without any distortion at the second output O2 of the FM demodulator DEM.

This undistorted signal, hereinafter referred to as signal S2, is obtained by the non-linear gain, occurring in the second amplifier-limiter AL2, of the strongly distorted input signal of the second amplifier-limiter AL2, i.e. the signal at the first output O1 of the FM demodulator DEM. The last-mentioned signal is shown by means of curve S1 in FIG. 4A and will hereinafter be denoted as signal S1. Due to stability requirements the gain in the IF tuning control loop should be comparatively small. To obtain a sinusoidal signal from the strongly distorted signal S1, the gain characteristic of the first amplifier-limiter AL1 is to correspond to that of the second amplifier-limiter AL2, on the understanding that the gain and the limiting level of the first amplifier-limiter AL1 should be smaller than those of the second amplifier-limiter AL2. In the case of a suitably chosen scaling factor of the gain of the first amplifier-limiter AL1 with respect to the second amplifier-limiter AL2, a substantially undistorted signal, in the given case a sinusoidal signal, is obtained as a tuning control signal for the IF filter RA1 at the output of the first amplifier-limiter AL1.

Consequently, the effect of an amplifier-limiter with a straight gain characteristic is obtained, viz. a signal processing without distortion while maintaining a low-interference capturing behaviour as a result of the actual gradual limitation which is obtained with the first and second amplifier-limiters AL1 and AL2.

The use of circuits with a mutually corresponding operation, such as the first tunable resonance amplifier RA1 and the second tunable resonance amplifier RA2, the first amplifier-limiter AL1 and the second amplifier-limiter AL2, the in-phase and quadrature multiplier circuits in the second mixer stage M2 and the multiplier circuit M3, as well as the common use of circuits in the two tuning control loops provides the possibility of considerable matching and hence simple and accurate manufacture.

It will be evident that the invention is not limited to the embodiment shown. For example, it is possible to realise a phase split by means of a resonance amplifier preceded by a single-phase tunable mixer stage, to use a conventional FM quadrature demodulator, for example, as known from German Patent Application 26 36 268 instead of the FM demodulator shown, to form the amplifier-limiters AL1 and second amplifier-limiter AL2 in a different manner (for example, asymmetrically), to derive the tuning control signal for the IF filter RA1 from the undistorted output signal at the second output O2 by means of a current or voltage divider instead of from the distorted signal at the first output O2 by means of the first amplifier-limiter AL1, to omit the second mixer stage M2 and to tune the tunable IF filter RA2 and the FM demodulator DEM to the first intermediate frequency, and to form the tunable IF filter with a plurality of cascade-arranged resonance amplifier stages.

It is claimed:

1. An FM receiver comprising: in cascade, a radio frequency (RF) section, means for a down-conversion of a desired RF FM reception signal to an intermediate frequency (IF) FM signal, an IF section comprising a tunable IF filter, and an FM demodulator for demodulating a baseband modulation signal of the IF FM signal, means coupling the demodulator to a baseband signal processing device, and an IF tuning control loop via which the FM demodulator is coupled to a tuning control input of the IF filter for an instantaneous tuning control of the IF filter by means of the baseband modulation signal, wherein a first amplifier-limiter is connected in the IF tuning control loop between an output of the FM demodulator and the tuning control input of the IF filter, the gain of said first amplifier-limiter gradually decreasing at an increasing input signal amplitude thereof, said first amplifier-limiter supplying an output signal whose amplitude increases monotonically to a limiting value for a continuous and gradual limitation of the tuning control signal in the IF tuning control loop at an increasing output signal amplitude of the FM demodulator.

2. An FM receiver as claimed in claim 1, wherein the FM demodulator comprises means for deriving, from the IF FM signal, a pair of FM-modulated signals having a mutually equal modulation signal and a phase difference which is 90 degrees on average at a carrier frequency and which varies with the FM modulation signal, said means for deriving comprising a tunable frequency-dependent phase-shifting circuit having a tuning control input, said FM demodulator also comprising a multiplier circuit coupled to the means for deriving and a demodulator tuning control loop including a low-pass filter via which an output of the multiplier circuit is coupled to the tuning control input of the frequency-dependent phase-shifting circuit, the gain in the IF tuning control loop being smaller than that in the demodulator tuning control loop.

3. An FM receiver as claimed in claim 2, wherein the demodulator tuning control loop of the FM demodulator includes a second amplifier-limiter coupled to said low-pass filter, an output of the second amplifier-limiter being coupled to the tuning control input of the tunable frequency-dependent phase-shifting circuit and to the baseband signal processing device, the gain of said second amplifier-limiter gradually decreasing at an increasing input signal amplitude thereof, said second amplifier-limiter supplying an output signal whose amplitude increases monotonically to a limiting value for a continuous and gradual limitation of the tuning control signal in the demodulator tuning control loop at an increasing output signal amplitude of the FM demodulator, a tuning frequency deviation in the frequency-dependent phase-shifting circuit occurring at the limiting value of the second amplifier-limiter being larger than the tuning frequency deviation in the IF filter occurring at the limiting value of the first amplifier-limiter.

4. An FM receiver as claimed in claim 3, wherein said low-pass filter is common to said two tuning control loops and is coupled between an output of the multiplier circuit of the FM demodulator and inputs of the first and second amplifier-limiters.

5. An FM receiver as claimed in claim 3 wherein each of the amplifier-limiters comprises an emitter-coupled transistor pair.

6. An FM receiver as claimed in claim 3 wherein the IF filter and the frequency-dependent phase-shifting circuit comprise first and second cascade-arranged resonance amplifiers, respectively, each having in-phase and quadrature inputs and outputs, said in-phase and quadrature inputs of the first resonance amplifier receiving in-phase and quadrature components of the IF signal, said in-phase and quadrature outputs of the first resonance amplifier being coupled to respective first inputs of first and second multiplier stages of the multiplier circuit, and said in-phase and quadrature outputs of the second resonance amplifier being coupled to second inputs of the second and first multiplier stages, respectively, outputs of the two multiplier stages being coupled to inputs of a superposition circuit for a mutual superposition of the output signals of the first and second multiplier stages, said superposition circuit being coupled to the low-pass filter which is coupled in common in said two tuning control loops.

7. An FM receiver as claimed in claim 2 wherein the IF filter and the frequency-dependent phase-shifting circuit comprise first and second cascade-arranged resonance amplifiers, respectively, each having in-phase and quadrature inputs and outputs, said in-phase and quadrature inputs of the first resonance amplifier receiving in-phase and quadrature components of the IF signal, said in-phase and quadrature outputs of the first resonance amplifier being coupled to respective first inputs of first and second multiplier stages of the multiplier circuit, and said in-phase and quadrature outputs of the second resonance amplifier being coupled to second inputs of the second and first multiplier stages, respectively, outputs of the two multiplier stages being coupled to inputs of a superposition circuit for a mutual superposition of output signals of the first and second multiplier stages, said superposition circuit being coupled to the low-pass filter which is coupled in common in said two tuning control loops.

8. An FM receiver circuit comprising:
a radio frequency (RF) stage,
means coupled to the radio frequency stage for converting an RF-FM signal received therefrom to an intermediate frequency (IF) FM signal,
an IF section including a tunable IF filter coupled to an output of the signal converting means,
an FM demodulator coupled to an output of the IF section for demodulating a baseband modulation signal of the IF FM signal, and
an IF tuning control loop coupling a baseband modulation signal output of the FM demodulator to a tuning control input of the tunable IF filter to provide a tuning control of the IF filter, said IF tuning control loop including a first amplifier-limiter coupled between the FM demodulator output and the tuning control input of the tunable IF filter, said first amplifier-limiter having its gain gradually decrease as its input signal increases in amplitude, whereby the first amplifier-limiter derives an output signal whose amplitude increases monotonically to a limiting value to provide a continuous and gradual limitation of the tuning control signal in the IF tuning control loop as the FM demodulator output baseband modulation signal increases in amplitude.

9. The FM receiver circuit of claim 8 wherein the FM demodulator further comprises;
a tunable phase-shift circuit coupled to the tunable IF filter of the IF section and having a tuning control input,
a multiplier circuit coupled to said tunable phaseshift circuit, and
a demodulator tuning control loop including a low pass filter coupled between an output of the multiplier circuit and the tuning control input of said tunable phase-shift circuit.

10. The FM receiver circuit of claim 9 wherein the demodulator tuning control loop further comprises a second amplifier-limiter connected in cascade with the low pass filter, said second amplifier-limiter having its gain gradually decrease as its input signal increases in amplitude whereby the second amplifier-limiter derives an output signal whose amplitude increases monotonically to a limiting value to provide a continuous and gradual limitation of the tuning control signal in the demodulator tuning control loop as the FM demodulator output baseband modulation signal increases in amplitude.

11. The FM receiver circuit of claim 10 wherein said low pass filter is common to the IF tuning control loop and to the demodulator tuning control loop, and the gain in the IF tuning control loop is lower than the gain in the demodulator tuning control loop.

12. The FM receiver circuit of claim 9 further comprising a second low pass filter connected in cascade with the first amplifier-limiter in the IF tuning control loop, and wherein the gain in the IF tuning control loop is lower than the gain in the demodulator tuning control loop.

13. The FM receiver circuit of claim 9 wherein the tunable IF filter and the tunable phase-shift circuit comprise first and second cascade connected resonance amplifiers, respectively, each having in-phase and quadrature inputs and outputs, said in-phase and quadrature inputs of the first resonance amplifier receiving in-phase and quadrature components of the IF signal, said in-phase and quadrature outputs of the first resonance amplifier being coupled to respective first inputs of first and second multiplier stages of the multiplier circuit, and said in-phase and quadrature outputs of the second resonance amplifier are coupled to second inputs of the second and first multiplier stages, respectively, outputs of the first and second multiplier stages being coupled to inputs of a combination circuit for a mutual combining of output signals of the first and second multiplier stages, said combination circuit being coupled to said low pass filter which is coupled in common to the IF tuning control loop and the demodulator tuning control loop.

14. The FM receiver circuit of claim 8 wherein the tunable IF filter includes a resonance amplifier having a bandwidth narrower than that of the baseband modulation signal.

15. The FM receiver circuit of claim 9 wherein the demodulator tuning control loop further comprises a second amplifier-limiter having a gain characteristic and a transfer characteristic that correspond to those of the first amplifier-limiter but wherein the gain and limiting level of the second amplifier-limiter are higher than those of the first amplifier-limiter.

* * * * *